(12) United States Patent
Liao et al.

(10) Patent No.: US 12,125,845 B2
(45) Date of Patent: Oct. 22, 2024

(54) ELECTRONIC DEVICE

(71) Applicant: INNOSCIENCE (ZHUHAI) TECHNOLOGY CO., LTD., Zhuhai (CN)

(72) Inventors: Hang Liao, Zhuhai (CN); Chunhua Zhou, Zhuhai (CN)

(73) Assignee: INNOSCIENCE (ZHUHAI) TECHNOLOGY CO., LTD., Zhuhai (CN)

(*) Notice: Subject to any disclaimer, the term of this patent is extended or adjusted under 35 U.S.C. 154(b) by 1140 days.

(21) Appl. No.: 16/958,157

(22) PCT Filed: Apr. 29, 2020

(86) PCT No.: PCT/CN2020/087765
§ 371 (c)(1),
(2) Date: Jun. 26, 2020

(87) PCT Pub. No.: WO2021/217494
PCT Pub. Date: Nov. 4, 2021

(65) Prior Publication Data
US 2022/0375926 A1    Nov. 24, 2022

(51) Int. Cl.
*H01L 29/778*   (2006.01)
*H01L 21/8252*  (2006.01)
(Continued)

(52) U.S. Cl.
CPC ...... *H01L 27/0629* (2013.01); *H01L 21/8252* (2013.01); *H01L 27/0605* (2013.01);
(Continued)

(58) Field of Classification Search
CPC ............. H01L 29/7786; H01L 29/7787; H01L 29/7788
See application file for complete search history.

(56) References Cited

U.S. PATENT DOCUMENTS 9,673,311 B1 *  6/2017  Moens ................. H01L 29/778
9,780,181 B1    10/2017 Mitsubishi
(Continued)

FOREIGN PATENT DOCUMENTS

CN   102651388 A   8/2012
CN   103151374 A   6/2013
(Continued)

OTHER PUBLICATIONS

Zhang, Li "p-GaN Gate Power Transistor With Distributed Built-in Schottky Barrier Diode for Low-Loss Reverse Conduction" IEEE Elec. Dev. Lett. vol. 41 No. 3 published Jan. 22, 2020 March edition pp. 341-344 (Year: 2020).*
(Continued)

*Primary Examiner* — Grant S Withers
(74) *Attorney, Agent, or Firm* — JCIPRNET

(57) ABSTRACT

A semiconductor structure includes a first nitride semiconductor layer; a second nitride semiconductor layer and a first conductive structure. The second nitride semiconductor layer is disposed on the first nitride semiconductor layer. The first conductive structure is disposed on the second nitride semiconductor layer. The first conductive structure functions as one of a drain and a source of a transistor and one of an anode and a cathode of a diode.

16 Claims, 14 Drawing Sheets

(51) Int. Cl.
  *H01L 27/06* (2006.01)
  *H01L 29/40* (2006.01)
  *H01L 29/66* (2006.01)

(52) U.S. Cl.
  CPC ...... *H01L 29/404* (2013.01); *H01L 29/66462* (2013.01); *H01L 29/7786* (2013.01); *H01L 29/7787* (2013.01)

(56) References Cited

U.S. PATENT DOCUMENTS

| | | | |
|---|---|---|---|
| 2012/0261673 A1 | 10/2012 | Schulze et al. | |
| 2014/0151749 A1* | 6/2014 | Jeon | H01L 29/7786 257/194 |
| 2014/0306235 A1 | 10/2014 | Decoutere et al. | |
| 2015/0357422 A1* | 12/2015 | Liao | H01L 23/3171 438/172 |
| 2018/0033669 A1* | 2/2018 | Salih | H01L 29/404 |

FOREIGN PATENT DOCUMENTS

| | | |
|---|---|---|
| CN | 103367356 A | 10/2013 |
| CN | 105720053 A | 6/2016 |
| CN | 105993078 A | 10/2016 |
| CN | 107331699 A | 11/2017 |
| JP | 2012169389 A | 9/2012 |
| JP | 2014110311 A | 6/2014 |
| KR | 20110033584 A | 3/2011 |
| KR | 20140105056 A | 9/2014 |

OTHER PUBLICATIONS

International Search Report and Written Opinion of the corresponding PCT application No. PCT/CN2020/087765 mailed on Jan. 27, 2021.

First Office Action of the corresponding China patent application No. 202080002669.8 mailed on Jun. 6, 2022.

* cited by examiner

ELECTRONIC DEVICE

BACKGROUND

1. Field of the Disclosure

The disclosure relates to an electronic device, and particularly to a group III-V electronic device.

2. Description of the Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies) due to their characteristics.

The semiconductor components may include a heterojunction bipolar transistor (HBT), a heterojunction field effect transistor (HFET), a high-electron-mobility transistor (HEMT), a modulation-doped FET (MODFET), or the like

SUMMARY

In some embodiments, a semiconductor structure includes a first nitride semiconductor layer; a second nitride semiconductor layer and a first conductive structure. The second nitride semiconductor layer is disposed on the first nitride semiconductor layer. The first conductive structure is disposed on the second nitride semiconductor layer. The first conductive structure functions as one of a drain and a source of a transistor and one of an anode and a cathode of a diode.

In some embodiments, a semiconductor structure includes a first nitride semiconductor layer, a transistor and a diode. The transistor has a drain and a source on a first surface of the first nitride semiconductor layer. The diode has an anode and a cathode on the first surface of the first nitride semiconductor layer. The anode and the cathode of the diode are arranged in a direction substantially parallel to the first surface of the first nitride semiconductor layer.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
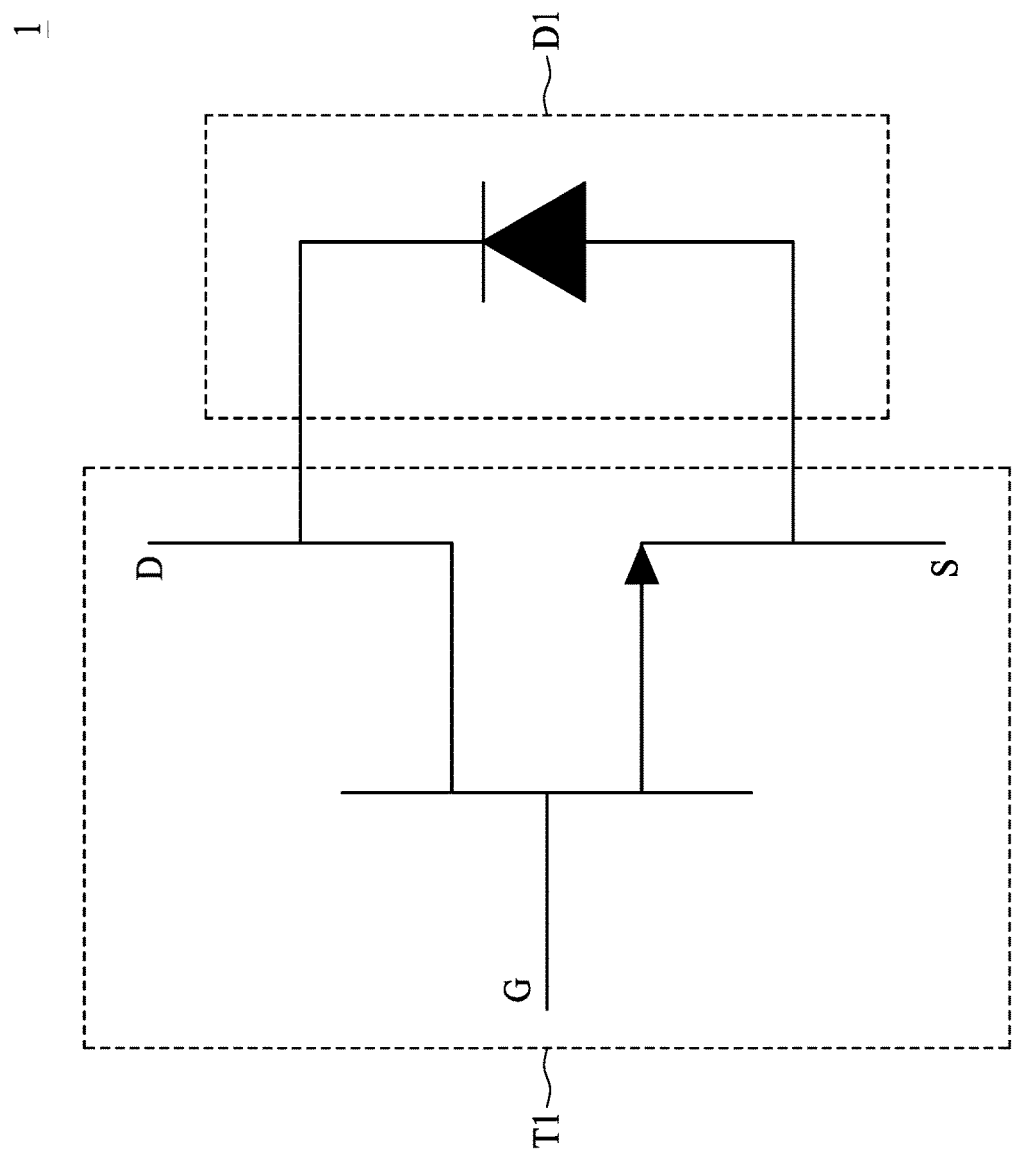
FIG. 1 illustrates a schematic diagram of an electronic device, in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Direct bandgap materials, such as group III-V compounds, may include, but are not limited to, for example, gallium arsenide (GaAs), indium phosphide (InP), gallium nitride (GaN), indium gallium arsenide (InGaAs), aluminum gallium arsenide (AlGaAs), and others.

FIG. 1 illustrates a schematic diagram of an electronic device 1, in accordance with some embodiments of the present disclosure. The electronic device 1 can include a transistor T1 and a diode D1.

In some embodiments, the transistor T1 may be formed of or include a direct bandgap material, such as an III-V compound, which includes but is not limited to, for example, GaAs, InP, GaN, InGaAs and AlGaAs. In some embodiments, the transistor T1 can include a group III nitride transistor. In some embodiments, the transistor T1 can include a GaN-based transistor. In some embodiments, the transistor T1 can include a high-electron-mobility transistor (HEMT). In some embodiments, the diode D1 may include a Schottky diode (or Schottky barrier diode (SBD)).

The transistor T1 may have a gate (G), a drain (D) and a source (S). In some embodiments, the transistor T1 may be or include a "normally-off" type of transistor. For example, in operation, if a voltage (i.e., $V_{gs}$) applied between the gate and the source of the transistor T1 is equal to or greater than a threshold voltage ($V_{th}$) of the transistor T1, the transistor T1 can be turned on to contact a current (e.g., from the drain to the source). If the voltage (i.e., $V_{gs}$) applied between the gate and the source of the transistor T1 is less than the threshold voltage ($V_{th}$) of the transistor T1, the transistor T1 would be turned off. In other embodiments, the transistor T1 may be or include a "normally-on" type of transistor depending on different design specifications.

As shown in FIG. 1, the diode D1 is connected to the transistor T1 in parallel. For example, the drain of the transistor T1 is electrically connected to a cathode of the diode D1, and the source of the transistor T1 is electrically connected to an anode of the diode D1. In some embodiments, the electronic device 1 can work in a power device (e.g., a DC-DC circuit). When the electronic device 1 works as or in a power device, the transistor T1 may be frequently switched (e.g., turn on and turn off). By connecting the diode D1 with the transistor T1 in parallel, the equivalent on-resistance of the electronic device 1 would decrease, which can reduce the power consumption of the electronic device 1.

Figure 2:
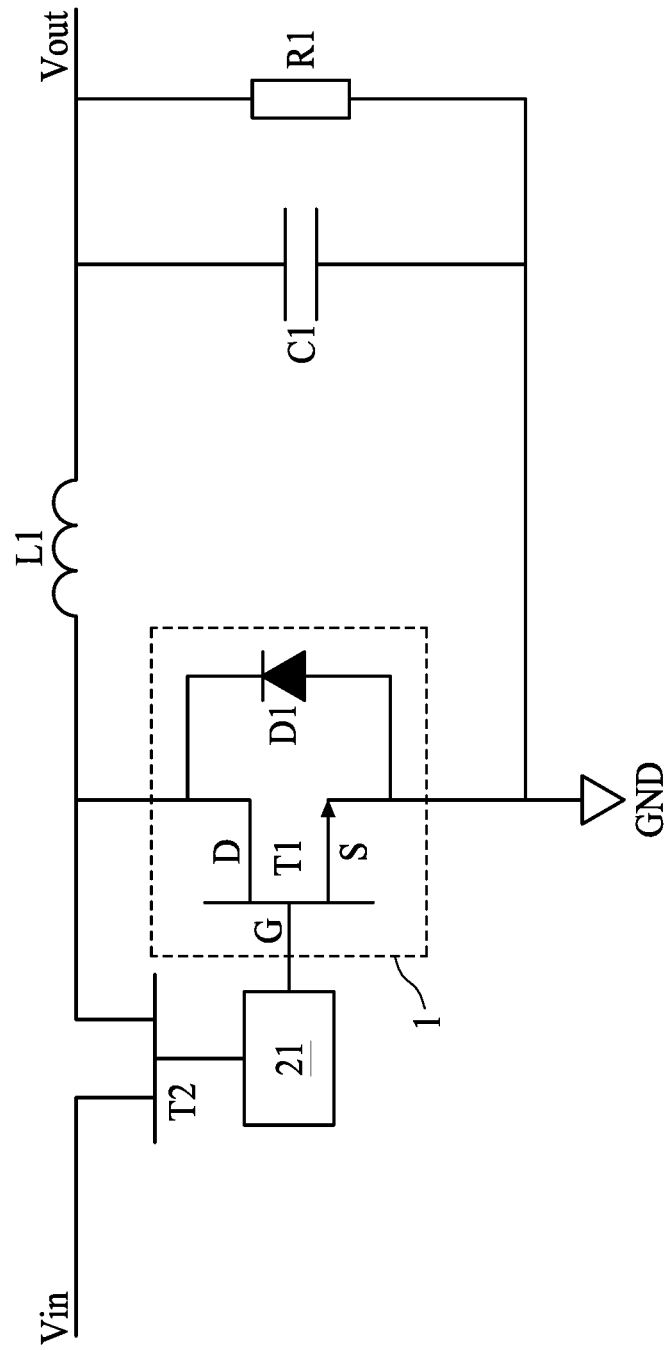
FIG. 2 illustrates a schematic diagram of an electronic device, in accordance with some embodiments of the present disclosure.

FIG. 2 illustrates a schematic diagram of an electronic device 2, in accordance with some embodiments of the present disclosure. In some embodiments, the electronic device 2 as shown in FIG. 2 may be or include a DC-DC circuit. For example, the electronic device 2 as shown in FIG. 2 may be or include a buck converter (or a step-down converter). For example, the electronic device 2 can be configured to step down voltage (while stepping up current) from its input voltage Vin to its output voltage Vout. The electronic device 2 can include the electronic device 1 as illustrated in FIG. 1, a transistor T2, an inductor L1, a capacitor C1, a resistor R1 and a controller (or driver) 21.

The controller 21 is connected to the gate of the transistor T1 and the gate of the transistor T2. In some embodiments, the controller 21 is configured to transmit complementary signal to the transistors T1 and T2 to control on/off state of the transistors T1 and T2. For example, if the signal transmitted to the transistor T1 has a logical value "1," the signal transmitted to the transistor T2 would have a logical value "0," and vice versa. For example, the controller 21 is configured to ensure that one of the transistors T1 and T2 is turned off while the other is turned on, so as to perform synchronous rectification.

The gate of the transistor T2 is connected to the controller 21 to receive a signal from the controller 21. The drain of the transistor T2 is connected to receive the input voltage Vin. The source of the transistor T2 is connected to the drain of the transistor T1 and the inductor L1. In the case that the signal received by the gate of the transistor T2 is higher than a threshold voltage of the transistor T2 (e.g., the signal inputted to the transistor T2 has a logical value "1"), the transistor T2 is turned on to conduct current, otherwise, the transistor T2 is turned off.

In some embodiments, the transistor T2 may be formed of or include a direct bandgap material, such as an III-V compound, which includes but is not limited to, for example, GaAs, InP, GaN, InGaAs and AlGaAs. In some embodiments, the transistor T2 can include a group III nitride transistor. In some embodiments, the transistor T2 can include a GaN-based transistor. In some embodiments, the transistor T2 can include a HEMT.

The gate of the transistor T1 is connected to the controller 21 to receive another signal from the controller 21, which is complementary to the signal received by the transistor T2. The drain of the transistor T1 is connected to the drain of the transistor T2 and the inductor L1. The source of the transistor T1 is connected to ground. In the case that the signal received by the gate of the transistor T1 is higher than a threshold voltage of the transistor T1 (e.g., the signal inputted to the transistor T1 has a logical value "1"), the transistor T1 is turned on to conduct current, otherwise, the transistor T1 is turned off.

The inductor L1 is connected between the drain of the transistor T1 or T2 and the output of the electronic device 2. The capacitor C1 is connected between the output of the electronic device 2 and ground. The resistor R1 is connected between the output of the electronic device 2 and ground.

In some embodiments, in operation, when the controller 21 is configured to turn on the transistor T2 and to turn off the transistor T1 (e.g., the electronic device 2 is at on-state), the transistor T2 is configured to conduct current to the inductor L1, the capacitor C1 and the resistor R1. When the current begins to increase, the inductor L1 is configured to produce an opposing voltage across its terminals in response to the changing current. This voltage drop counteracts the input voltage Vin and therefore reduces the output voltage Vout. For example, the output voltage Vout may be substantially equal to the input voltage Vin minus the voltage drop of the inductor L1 and the voltage drop (e.g., $V_{DS}$) between the drain and the source of the transistor T2. Over time, the rate of change of current decreases, and the voltage across the inductor L1 also decreases, which may increase the output voltage Vout. During this time, the inductor L1 is configured to store energy in the form of a magnetic field. In the case that the controller 21 is configured to turn off the transistor T2 and to turn on the transistor T1 (e.g., the electronic device 2 is at off-state), the electronic device 2 is disconnected from the input voltage Vin, and the current would decrease. The decreasing current would produce a voltage drop across the inductor (opposite to the voltage drop at on-state), and the inductor L1 is configured to work as a current source. The stored energy in the inductor's magnetic field supports the current flowing from the transistor T1 to the output of the electronic device 2 through the inductor L2 to make up for the reduction in the output voltage Vout.

Figure 3:
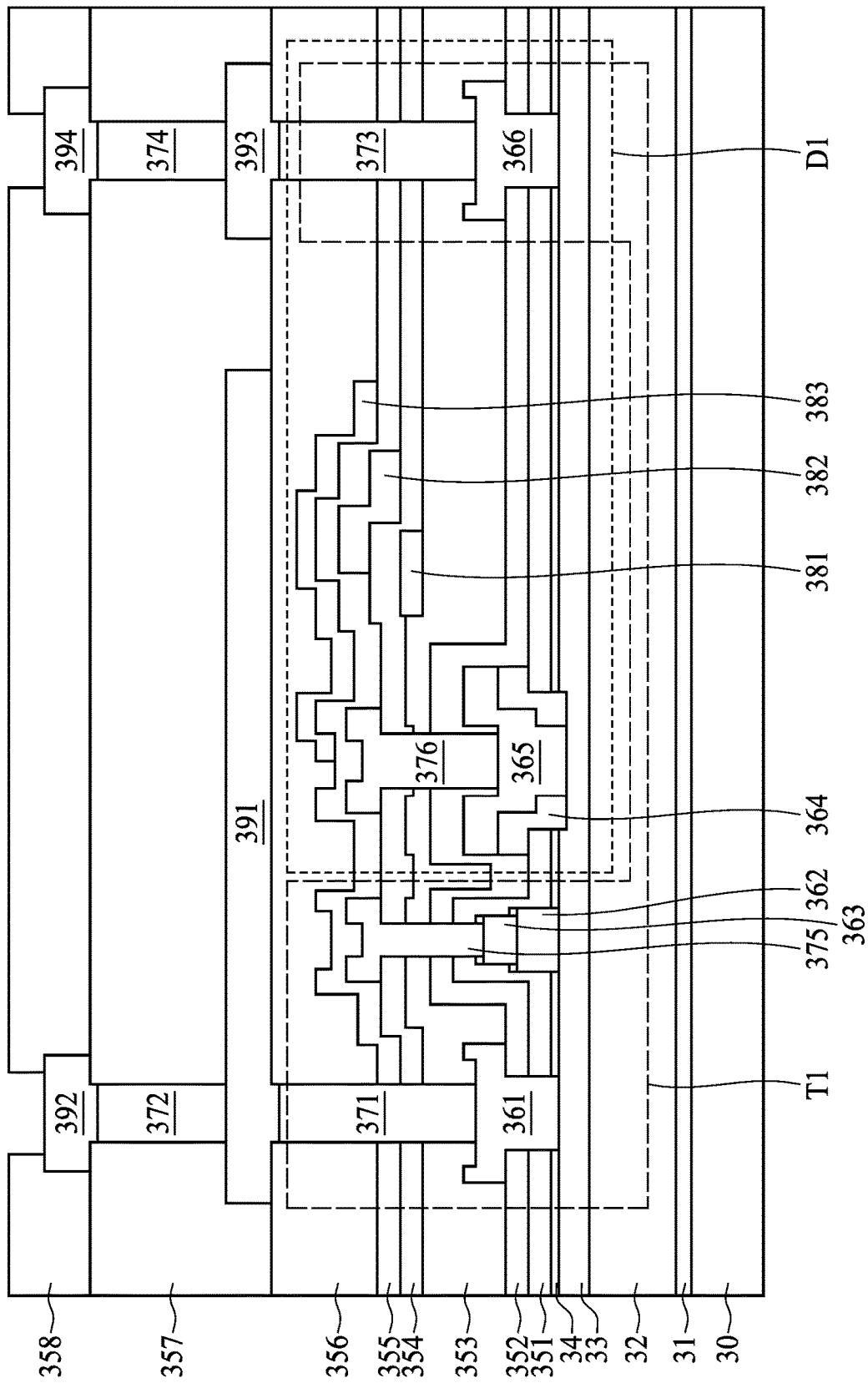
FIG. 3 illustrates a cross-sectional view of a semiconductor structure, in accordance with some embodiments of the present disclosure.

FIG. 3 illustrates a cross-sectional view of a semiconductor structure 3, in accordance with some embodiments of the present disclosure. In some embodiments, the electronic device 1 as described and illustrated with reference to FIG. 1 can have a similar or same the cross-sectional view of the semiconductor structure 3 as shown in FIG. 3.

For example, the semiconductor structure 3 as shown in FIG. 3 includes a transistor T1 and a diode D1 connected in parallel as shown in FIG. 1. The semiconductor structure 3 includes a substrate 30, a buffer layer 31, semiconductor layers 32 and 33, an insulation layer 34, a doped semiconductor layer 362, conductive structures 361, 363, 365, 366, 371, 372, 373, 374, 391, 392, 393, 394, field plates 381, 382, 383 and passivation layers 351, 352, 353, 354, 355, 356, 357, 358.

The substrate 30 may include, for example, but is not limited to, silicon (Si), doped Si, silicon carbide (SiC) or other suitable material(s). In some embodiments, the substrate 30 may include a p-type semiconductor material. The substrate 30 may include a p-type semiconductor material having a doping concentration of about $10^{17}$ atoms/cm$^3$ to about $10^{21}$ atoms/cm$^3$. The substrate 30 may include a p-type semiconductor material having a doping concentration of about $10^{19}$ atoms/cm$^3$ to about $10^{21}$ atoms/cm$^3$. The substrate 30 may include a p-type semiconductor material having a doping concentration of about $10^{20}$ atoms/cm$^3$ to about $10^{21}$ atoms/cm$^3$. In some embodiments, the substrate 30 may include a p-type doped silicon layer. In some embodiments, the substrate 30 may include a silicon layer doped with arsenic (As). In some embodiments, the substrate 30 may include a silicon layer doped with phosphorus (P). In some embodiments, the substrate 30 may include an n-type semiconductor material. The substrate 30 may include an n-type semiconductor material having a doping concentration of about $10^{17}$ atoms/cm$^3$ to about $10^{21}$ atoms/cm$^3$. The substrate 30 may include an n-type semiconductor material having a doping concentration of about $10^{19}$ atoms/cm$^3$ to about $10^{21}$ atoms/cm$^3$. The substrate 30 may include an n-type semiconductor material having a doping concentration of about $10^{20}$ atoms/cm$^3$ to about $10^{21}$ atoms/cm$^3$. In some embodiments, the substrate 30 may include an n-type doped silicon layer. In some embodiments, the substrate 30 may include a silicon layer doped with boron (B). In some embodiments, the substrate 30 may include a silicon layer doped with gallium (Ga).

The buffer layer 31 may be disposed on the substrate 30. In some embodiments, the buffer layer 31 may include nitrides. In some embodiments, the buffer layer 31 may include, for example, but is not limited to, aluminum nitride (AlN). In some embodiments, the buffer layer 31 may include, for example, but is not limited to, aluminum gallium nitride (AlGaN). In some embodiments, the buffer layer 31 may include a multilayer structure. In some other embodiments, the buffer layer 31 can include a single layer structure.

The semiconductor layer 32 may be disposed on the buffer layer 31. The semiconductor layer 32 may include a III-V material or compound. The semiconductor layer 32 may include, for example, but is not limited to, a group III nitride. The semiconductor layer 32 may include, for example, but is not limited to, gallium nitride (GaN). The semiconductor layer 32 may include, for example, but is not limited to, aluminum nitride (AlN). The semiconductor layer 32 may include, for example, but is not limited to, indium nitride (InN). The semiconductor layer 32 may include, for example, but is not limited to, a compound of $In_xAl_yGa_{(1-x-y)}N$, where $x+y \leq 1$. The semiconductor layer 32 may include, for example, but is not limited to, a compound of $Al_yGa_{(1-y)}N$, where $y \leq 1$.

The semiconductor layer 33 may be disposed on the semiconductor layer 32. The semiconductor layer 33 may include, for example, but not limited to, a group III nitride. The semiconductor layer 33 may include, for example, but not limited to, a compound of $Al_yGa_{(1-y)}N$, where $y \leq 1$. The semiconductor layer 33 may include, for example, but is not limited to, GaN. The semiconductor layer 33 may include, for example, but is not limited to, AlN. The semiconductor layer 33 may include, for example, but is not limited to, InN. The semiconductor layer 33 may include, for example, but is not limited to, a compound of $In_xAl_yGa_{(1-x-y)}N$, where $x+y \leq 1$.

A heterogeneous interface can be formed between the semiconductor layer 33 and the semiconductor layer 32. The semiconductor layer 33 may have a relatively greater band gap than the semiconductor layer 32. For example, the semiconductor layer 33 may include AlGaN, the AlGaN may have a band gap of about 4 eV, the semiconductor layer 32 may include GaN, and GaN may have a band gap of about 3.4 eV.

In some embodiments, the semiconductor layer 32 may function as or include an electron channel region (or channel layer). The channel region may include a two-dimensional electron gas (2DEG) region, which is generally available in a heterostructure. In the 2DEG region, the electron gas can move freely in a two-dimensional direction (or lateral direction), but is limited in the movement in another dimension (e.g. vertical direction). In some embodiments, the channel region can be formed within the semiconductor layer 32. In some embodiments, the channel region can be formed adjacent to an interface between the semiconductor layer 32 and the semiconductor layer 33.

In some embodiments, the semiconductor layer 33 may function as a barrier layer. For example, the semiconductor layer 33 may function as a barrier layer provided on the semiconductor layer 32.

The insulation layer 34 is disposed on the semiconductor layer 33. In some embodiments, the insulation layer 34 may be disposed on a portion of a top surface of the doped semiconductor layer 362 exposed from the conductive structure 363. In some embodiments, the insulation layer 34 is disposed on a portion of a top surface of the conductive structure 363 exposed from the conductive structure 375. The insulation layer 34 may include a dielectric material. The insulation layer 34 may include nitride. The insulation layer 34 may include, for example, but not limited to, silicon nitride ($Si_3N_4$). The insulation layer 34 may include oxide. The insulation layer 34 may include, for example, but not limited to, silicon oxide ($SiO_2$).

The doped semiconductor layer 362 may be disposed on the semiconductor layer 33. In some embodiments, the doped semiconductor layer 362 may penetrate the insulation layer 34 and contact a top surface of the semiconductor layer 33. The doped semiconductor layer 362 may include a doped III-V material. In some embodiments, the doped semiconductor layer 362 may include a p-type III-V group material. The doped semiconductor layer 362 may include, for example, but not limited to, a p-type group III nitride. The doped semiconductor layer 362 may include, for example, but is not limited to, p-type GaN. The doped semiconductor layer 362 may include, for example, but is not limited to, a p-type AlN. The doped semiconductor layer 362 may include, for example, but is not limited to, a p-type InN. The doped semiconductor layer 362 may include, for example, but is not limited to, p-type AlGaN. The doped semiconductor layer 362 may include, for example, but is not limited to, p-type InGaN. The doped semiconductor layer 362 may include, for example, but is not limited to, a p-type InAlN. When the doped semiconductor layer 362 includes a p-type III-V group material, the doped material of the doped semiconductor layer 362 may include, for example, but is not limited to, at least one of Mg, Zn, and Ca.

The doped semiconductor layer 362 may also include other p-type semiconductor materials. The doped semiconductor layer 362 may include, for example, but is not limited to, p-type CuO. The doped semiconductor layer 362 may include, for example, but is not limited to, p-type $NiO_x$. When the doped semiconductor layer 362 includes p-type CuO, the doping material of the doped semiconductor layer 362 may include, for example, but is not limited to, at least one of Mg, Zn, and Ca. When the doped semiconductor layer 362 includes p-type $NiO_x$, the doped material of the doped semiconductor layer 362 may include, for example, but is not limited to, at least one of Mg, Zn, and Ca.

The doped semiconductor layer 362 may include a p-type semiconductor material having a doping concentration of about $10^{17}$ atoms/cm$^3$ to about $10^{21}$ atoms/cm$^3$. The doped semiconductor layer 362 may include a p-type semiconductor material having a doping concentration of about $10^{19}$ atoms/cm$^3$ to about $10^{21}$ atoms/cm$^3$. The doped semiconductor layer 362 may include a p-type semiconductor material having a doping concentration of about $10^{20}$ atoms/cm$^3$ to about $10^{21}$ atoms/cm$^3$.

The conductive structure 363 may be disposed on the doped semiconductor layer 362. The doped semiconductor layer 362 is disposed between the conductive structure 363 and the semiconductor layer 33. In some embodiments, the conductive structure 363 may include metal. The conductive structure 363 may include, for example, but is not limited to, gold (Au), platinum (Pt), titanium (Ti), palladium (Pd), nickel (Ni), and tungsten (W). In some embodiments, the conductive structure 363c may include alloy. The conductive structure 363 may include, for example, but is not limited to, titanium nitride (TiN).

The conductive structure 375 may be disposed on the conductive structure 363. The conductive structure 375 may serve as a through via. The conductive structure 375 may serve as a through via electrically connecting the conductive structure 363 to the outside. For example, the conductive structure 375 may be disposed on the passivation layer 354 and penetrate the passivation layers 351, 352, 353 and 354 to electrically connect to the conductive structure 363. The conductive structure 375 may include metal. The conductive structure 375 may include a metal compound. The conductive structure 375 may include, for example, but not limited to, copper (Cu), tungsten (W), titanium (Ti), titanium nitride (TiN), or aluminum copper (Al—Cu).

In some embodiments, the conductive structure 375 (or the conductive structure 363) may function as a gate (or a gate terminal) of the transistor T1. For example, the conductive structure 375 may be configured to control the channel region (or the 2DEG) in the semiconductor layer 32. For example, the conductive structure 375 may be applied with a voltage to control the channel region in the semiconductor layer 32. For example, the conductive structure 375 may be applied with a voltage to control the channel region in the semiconductor layer 32 and below the conductive structure 375. For example, the conductive structure 375 may be applied with a voltage to control the conduction or control the conduction between the conductive structure 361 and the conductive structure 365.

The conductive structure 361 is disposed on the semiconductor layer 33. The conductive structure 361 may be disposed on the passivation layer 352. The conductive structure 361 may penetrate the passivation layers 351, 352 and the insulation layer 34. The conductive structure 361 may conduct a top surface of the semiconductor layer 33. The conductive structure 361 may include a metal. In some embodiments, the conductive structure 361 may include, for example, but not limited to, aluminum (Al), titanium (Ti), palladium (Pd), nickel (Ni), and tungsten (W). In some embodiments, the conductive structure 361 may include a metal alloy. The conductive structure 361 may include, for example, but not limited to, titanium nitride (TiN). In some embodiments, the conductive structure 361 may be or include a multi-layer structure. For example, the conductive structure 361 may include Ti, AlSi, Ti and TiN.

The conductive structure 371 may be disposed on the conductive structure 361. The conductive structure 371 may serve as a through via. The conductive structure 371 may serve as a through via electrically connecting the conductive structure 361 to the outside. For example, the conductive structure 371 may penetrate the passivation layers 353, 354, 355 and 356 to electrically connect to the conductive structure 361. The conductive structure 371 may include metal. The conductive structure 371 may include a metal compound. The conductive structure 371 may include, for example, but not limited to, copper (Cu), tungsten (W), titanium (Ti), titanium nitride (TiN), or aluminum copper (Al—Cu). In some embodiments, the conductive structure 371 (or the conductive structure 361) may function as a source (or a source terminal) of the transistor T1.

The insulation layer 364 is disposed on the semiconductor layer 33. The insulation layer 364 is disposed on the passivation layer 351. In some embodiments, the insulation layer 364 may penetrate the passivation layer 351, the insulation layer 34 and a portion of the semiconductor layer 33. For example, the passivation layer 351, the insulation layer 34 and a portion of the semiconductor layer 33 may cover a least a portion of a lateral surface (or sidewall) of the insulation layer 364. In other embodiments, the insulation layer 364 may not extend within the semiconductor layer 33. For example, a bottom surface of the insulation layer 364 is in contact with a top surface of the semiconductor layer 33. The insulation layer 364 may include a dielectric material. The insulation layer 364 may include nitride. The insulation layer 364 may include, for example, but not limited to, silicon nitride ($Si_3N_4$). The insulation layer 364 may include oxide. The insulation layer 364 may include, for example, but not limited to, silicon oxide ($SiO_2$).

The conductive structure 365 is disposed on the semiconductor layer 33. The conductive structure 365 is disposed on the insulation layer 364. In some embodiments, the conductive structure 365 may penetrate the passivation layer 351, the insulation layer 34 and a portion of the semiconductor layer 33. In other embodiments, the conductive structure 365 may not extend within the semiconductor layer 33. For example, a bottom surface of the conductive structure 365 is in contact with a top surface of the semiconductor layer 33. The conductive structure 365 may include a metal. In some embodiments, the conductive structure 365 may include, for example, but not limited to, titanium (Ti) and nickel (Ni). In some embodiments, the conductive structure 365 may include a metal alloy. The conductive structure 365 may include, for example, but not limited to, titanium nitride (TiN).

The conductive structure 376 is disposed on the conductive structure 365. The conductive structure 376 may serve as a through via. The conductive structure 376 may serve as a through via electrically connecting the conductive structure 365 to the outside. For example, the conductive structure 376 may be disposed on the passivation layer 354 and penetrate the passivation layers 352, 353 and 354 to electrically connect to the conductive structure 365. The conductive structure 376 may include metal. The conductive structure 376 may include a metal compound. The conductive structure 376 may include, for example, but not limited to, copper (Cu), tungsten (W), titanium (Ti), titanium nitride (TiN), or aluminum copper (Al—Cu). In some embodiments, the conductive structure 376 (or the conductive structure 365) may function as an anode of the diode D1.

In some embodiments, the conductive structure 365 may be disposed between the conductive structure 363 and the conductive structure 366. For example, a distance between the conductive structure 365 and the conductive structure 363 is less than a distance between the conductive structure 366 and the conductive structure 363. For example, the conductive structure 365 is closer to the conductive structure 363 than the conductive structure 366. For example, the conductive structure 366 is farther from the conductive structure 363 than the conductive structure 365.

The conductive structure 366 is disposed on the semiconductor layer 33. The conductive structure 366 may be disposed on the passivation layer 352. The conductive structure 366 may penetrate the passivation layers 351, 352 and the insulation layer 34. The conductive structure 366 may conduct a top surface of the semiconductor layer 33. The conductive structure 366 may include a metal. In some embodiments, the conductive structure 366 may include, for example, but not limited to, aluminum (Al), titanium (Ti), palladium (Pd), nickel (Ni), and tungsten (W). In some embodiments, the conductive structure 366 may include a metal alloy. The conductive structure 366 may include, for example, but not limited to, titanium nitride (TiN). In some embodiments, the conductive structure 366 may be or include a multi-layer structure. For example, the conductive structure 366 may include Ti, AlSi, Ti and TiN.

The conductive structure 373 may be disposed on the conductive structure 366. The conductive structure 373 may serve as a through via. The conductive structure 373 may serve as a through via electrically connecting the conductive structure 366 to the outside. For example, the conductive structure 373 may penetrate the passivation layers 353, 354, 355 and 356 to electrically connect to the conductive structure 366. The conductive structure 373 may include metal. The conductive structure 373 may include a metal compound. The conductive structure 373 may include, for example, but not limited to, copper (Cu), tungsten (W), titanium (Ti), titanium nitride (TiN), or aluminum copper (Al—Cu).

In some embodiments, the conductive structure 373 (or the conductive structure 366) may function as a drain (or a drain terminal) of the transistor T1. In some embodiments, the conductive structure 373 (or the conductive structure 366) may function as a cathode of the diode D1. In some embodiments, the conductive structure 373 (or the conductive structure 366) may function as both the drain of the transistor T1 and the cathode of the diode D1. For example, the cathode of the diode D1 and the drain of the transistor T1 share an electrical contact or electrode (i.e., the conductive structure 373 or 366).

The field plate 381 is disposed on the passivation layer 353. The field plate 381 may be covered by the passivation layer 354. The field plate 382 is disposed on the passivation layer 354. The field plate 382 may be covered by the passivation layer 355. The field plate 383 is disposed on the passivation layer 355. The field plate 382 may be covered by the passivation layer 356. The field plate 381, the field plate 382 and the field plate 383 are not in contact with each other. The field plate 381, the field plate 382 and the field plate 383 are spaced apart from each other. In some embodiments, the field plate 381, the field plate 382 and the field plate 383 may be partially or fully overlapping in a direction substantially perpendicular to a top surface of the substrate 30. In some embodiments, the field plate 381 can be at zero potential. The field plate 382 can be at zero potential. The field plate 383 can be at zero potential.

In some embodiments, the field plate 381 can be connected to the conductive structure 371 (e.g., the source terminal), the conductive structure 375 (e.g., the gate terminal) and/or the conductive structure 373 (e.g., the drain terminal) through other conductor structures. The field plate 382 can be connected to the conductive structure 371, the conductive structure 375 and/or the conductive structure 373 through other conductor structures. The field plate 383 can be connected to the conductive structure 371, the conductive structure 375 and/or the conductive structure 373 through other conductor structures.

The field plate 381 can reduce the electric field between the gate terminal (e.g., the doped semiconductor layer 362) and the drain terminal (e.g., the conductive structure 366). For example, the field plate 381 can reduce the electric field adjacent to the drain terminal. The field plate 382 can reduce the electric field between the gate terminal and the drain terminal. For example, the field plate 382 can reduce the electric field adjacent to the drain terminal. The field plate 383 can reduce the electric field between the gate terminal and the drain terminal. For example, the field plate 383 can reduce the electric field adjacent to the drain terminal.

The field plate 381 can allow the electric field between the conductor structures (for example, the doped semiconductor layer 365 and the conductive structure 366) to distribute evenly, improve the tolerance to voltage, and permit the voltage to release slowly, thereby improving the reliability of the transistor T1. The field plate 382 can allow the electric field between the conductor structures (for example, the doped semiconductor layer 365 and the conductive structure 366) to distribute evenly, improve the tolerance to voltage, and permit the voltage to release slowly, thereby improving the reliability of the transistor T1. The field plate 383 can allow the electric field between the conductor structures (for example, the doped semiconductor layer 365 and the conductive structure 366) to distribute evenly, improve the tolerance to voltage, and permit the voltage to release slowly, thereby improving the reliability of the transistor T1.

Although the drawing of the present disclosure depicts that the semiconductor structure 3 has three field plates, the present disclosure is not limited thereto. In some embodiments, the semiconductor structure 3 may include more or less field plates.

The conductive structure 391 is disposed on the passivation layer 356 and electrically connected to the conductive structure 371. The conductive structure 393 is disposed on the passivation layer 356 and electrically connected to the conductive structure 373. The conductive structure 391 and the conductive structure 393 may include metal. The conductive structure 391 and the conductive structure 393 may include a metal compound. The conductive structure 391 and the conductive structure 393 may include, for example, but not limited to, copper (Cu), tungsten carbide (WC), titanium (Ti), titanium nitride (TiN), or aluminum copper (Al—Cu).

The conductive structure 392 is disposed on the passivation layer 357 and electrically connected to the conductive structure 391 through the conductive structure 372. For example, the conductive structure 372 may function as a through via. The conductive structure 372 may penetrate the passivation layer 357 to electrically connect the conductive structure 392 with the conductive structure 391. The conductive structure 394 is disposed on the passivation layer 357 and electrically connected to the conductive structure 393 through the conductive structure 374. For example, the conductive structure 374 may function as a through via. The conductive structure 374 may penetrate the passivation layer 357 to electrically connect the conductive structure 394 with the conductive structure 393. The conductive structure 392 and the conductive structure 394 may include metal. The conductive structure 392 and the conductive structure 394 may include a metal compound. The conductive structure 392 and the conductive structure 394 may include, for example, but not limited to, copper (Cu), tungsten (W), titanium (Ti), titanium nitride (TiN), or aluminum copper (Al—Cu).

The passivation layer 358 is disposed on the passivation layer 357. The passivation layer 358 covers a portion of the conductive structures 392 and 394. The passivation layer 358 exposes another portion of the conductive structures 392 and 394 for electrical connections. In some embodiments, the passivation layers 351, 352, 353, 354, 355, 356, 357 and 358 may include the same material. Alternatively, the passivation layers 351, 352, 353, 354, 355, 356, 357 and 358 may include different materials. The passivation layers 351, 352, 353, 354, 355, 356, 357 and 358 may serve as an interlayer dielectric layer. The passivation layers 351, 352, 353, 354, 355, 356, 357 and 358 may include a dielectric material. The passivation layers 351, 352, 353, 354, 355, 356, 357 and 358 may include a nitride. The passivation layers 351, 352, 353, 354, 355, 356, 357 and 358 may include, for example, but not limited to, silicon nitride ($Si_3N_4$). The passivation layers 351, 352, 353, 354, 355, 356, 357 and 358 may include an oxide. The passivation layers 351, 352, 353, 354, 355, 356, 357 and 358 may include, for example, but not limited to, silicon oxide ($SiO_2$).

In some comparative embodiments, the transistor T1 and the diode D1 of the electronic device 1 as shown in FIG. 1 are discretely disposed on a circuit board (e.g., a printed circuit board (PCB) or a mother board) and electrically connected to each other at the package level or the circuit board level. However, the separate dies or components (e.g., the transistor T1 and the diode D1) increase fabrication cost, packaging cost, area consumed on a circuit board, and result in increased parasitic inductance, capacitance and resistance due to interconnections required at the packaging level and/or the circuit board level.

In accordance with the embodiments, as shown in FIG. 3, the transistor T1 and the diode D1 are monolithically integrated into the semiconductor structure 3. For example, the diode D1 and the transistor T1 are integrated on a single substrate 30 (or on a single semiconductor layer 32 or 33). By integrating the diode D1 and the transistor T1, the size and the manufacturing cost of the semiconductor structure 3 can be reduced. Furthermore, as shown in FIG. 3, since the cathode of the diode D1 and the drain of the transistor T1 share an electrical contact or electrode (i.e., the conductive structure 366 or 373), the size and the manufacturing cost of the semiconductor structure 3 can be further reduced. In addition, the issues of parasitic inductance, capacitance and resistance can be mitigated.

FIG. 4A, FIG. 4B, FIG. 4C, FIG. 4D, FIG. 4E, FIG. 4F, FIG. 4G, FIG. 4H, FIG. 4I, FIG. 4J and FIG. 4K illustrate several operations in manufacturing a semiconductor structure, in accordance with some embodiments of the present disclosure. In some embodiments, the operations illustrated in FIG. 4A, FIG. 4B, FIG. 4C, FIG. 4D, FIG. 4E, FIG. 4F, FIG. 4G, FIG. 4H, FIG. 4I, FIG. 4J and FIG. 4K can be used to manufacture the semiconductor structure 3 as shown in FIG. 3.

Figure 4A:
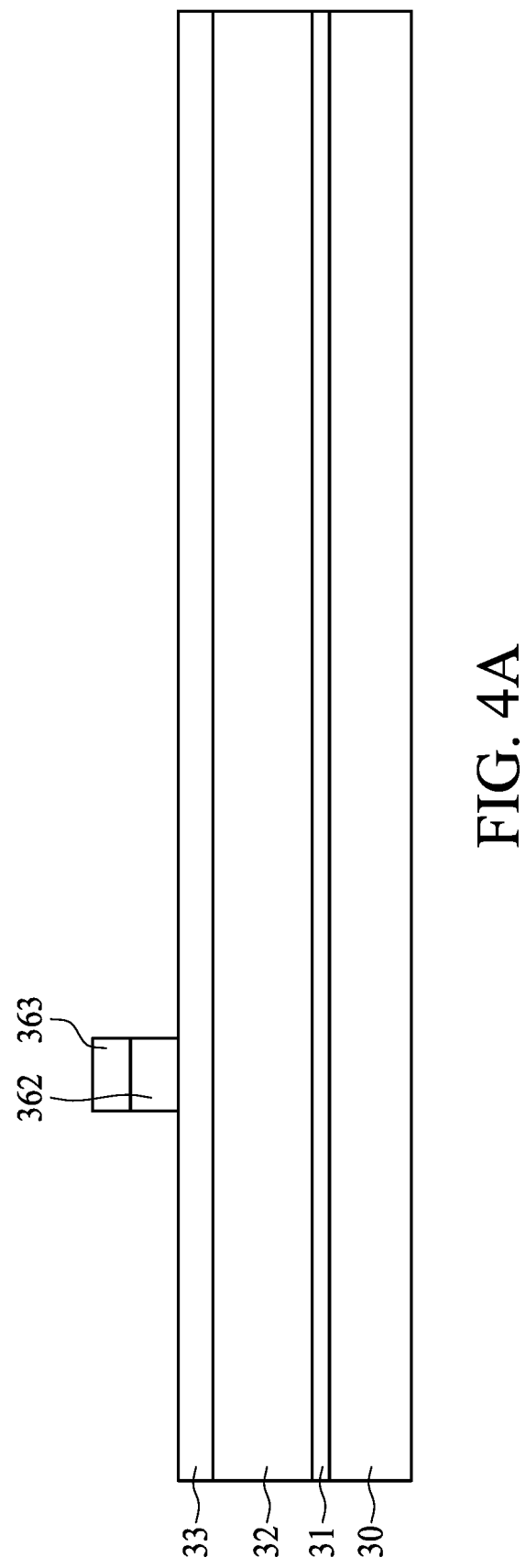
FIG. 4A, FIG. 4B, FIG. 4C, FIG. 4D, FIG. 4E, FIG. 4F, FIG. 4G, FIG. 4H, FIG. 4I, FIG. 4J and FIG. 4K illustrate several operations in manufacturing a semiconductor structure, in accordance with some embodiments of the present disclosure.

Referring to FIG. 4A, a substrate 30 is provided. A buffer layer 31 is disposed on the substrate 30. A semiconductor layer 32 is formed on the buffer layer 31. In some embodiments, the semiconductor layer 32 may be formed on the buffer layer 31 by, for example, epitaxial growth or any other suitable operations. A semiconductor layer 33 is formed on the semiconductor layer 32. In some embodiments, the semiconductor layer 33 may be formed on the semiconductor layer 32 by, for example, epitaxial growth or any other suitable operations.

A doped semiconductor layer 362 is formed on the semiconductor layer 33. A conductive structure 363 is formed on the doped semiconductor layer 362. In some embodiments, the doped semiconductor layer 362 and the conductive structure 363 may be formed on the following operations: (i) forming a doped semiconductor layer on the semiconductor layer 33 to fully cover the semiconductor layer 33; (ii) forming a metal layer on the doped semiconductor layer to fully cover the doped semiconductor layer; and (iii) removing a portion of the doped semiconductor layer and the metal layer to form the doped semiconductor layer 362 and the conductive structure 363 as shown in FIG. 4A.

In some embodiments, in operation (i), the doped semiconductor layer can be formed by epitaxial growth by metal organic chemical vapor deposition (MOCVD), and a dopant is doped therein. In some embodiments, in operation (ii), the metal layer can be formed by physical vapor deposition (PVD), chemical vapor deposition (CVD), atomic layer deposition (ALD), plating, and/or other suitable deposition steps. In some embodiments, the metal layer is formed in a Gate First process, that is, before the source (e.g., the conductive structure 361) and the drain (e.g., the conductive structure 366) are formed.

In some embodiments, in operation (iii), a patterned hard mask is disposed over the metal layer. The doped semiconductor layer 362 and the conductive structure 363 can then be formed by etching a portion of the metal layer and the doped semiconductor layer. In some embodiments, the etching operation may include dry etching, wet etching, or a combination of dry and wet etching. In some embodiments, the patterned hard mask may include silicon nitride (SiN), silicon oxynitride (SiON), silicon carbide (SiC), or the like. In some embodiments, the etchant for etching the metal layer may be or include aqueous ammonia ($NH_4OH$), hydrogen peroxide ($H_2O_2$), sulfuric acid ($H_2SO_4$), hydrofluoric acid (HF), ammonium fluoride ($NH_4F$), or a mixture of the foregoing compounds.

Figure 4B:
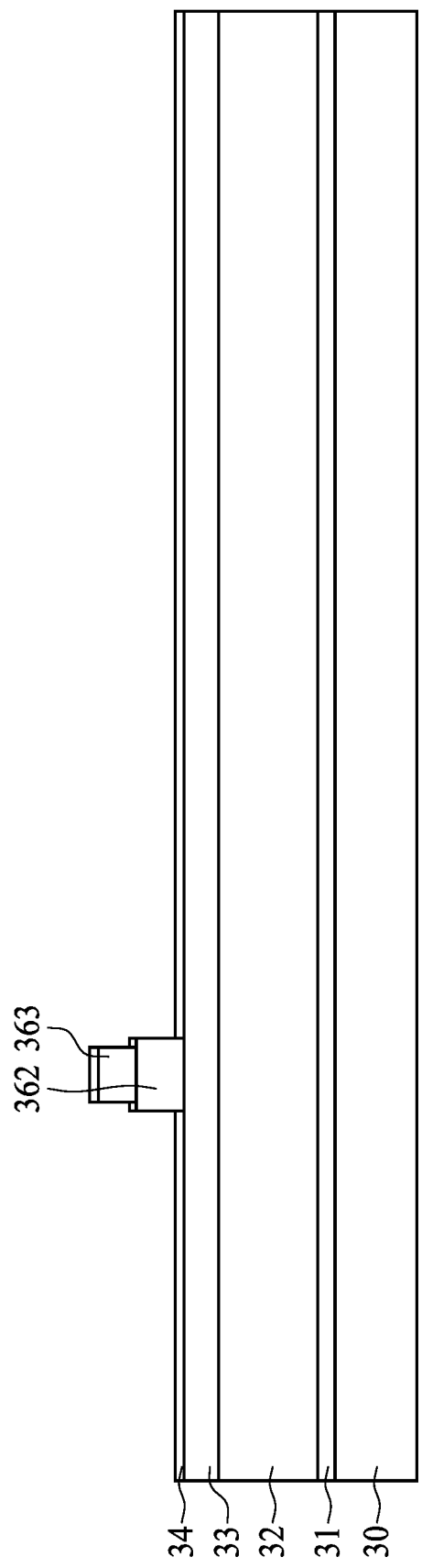

Referring to FIG. 4B, an insulation layer 34 is formed on the semiconductor layer 33. In some embodiments, the insulation layer 34 may be formed on a portion of a top surface of the doped semiconductor layer 362 exposed from the conductive structure 363. In some embodiments, the insulation layer 34 is formed on a top surface of the conductive structure 363. In some embodiments, the insulation layer may be formed by a deposition or any other suitable operations.

Figure 4C:
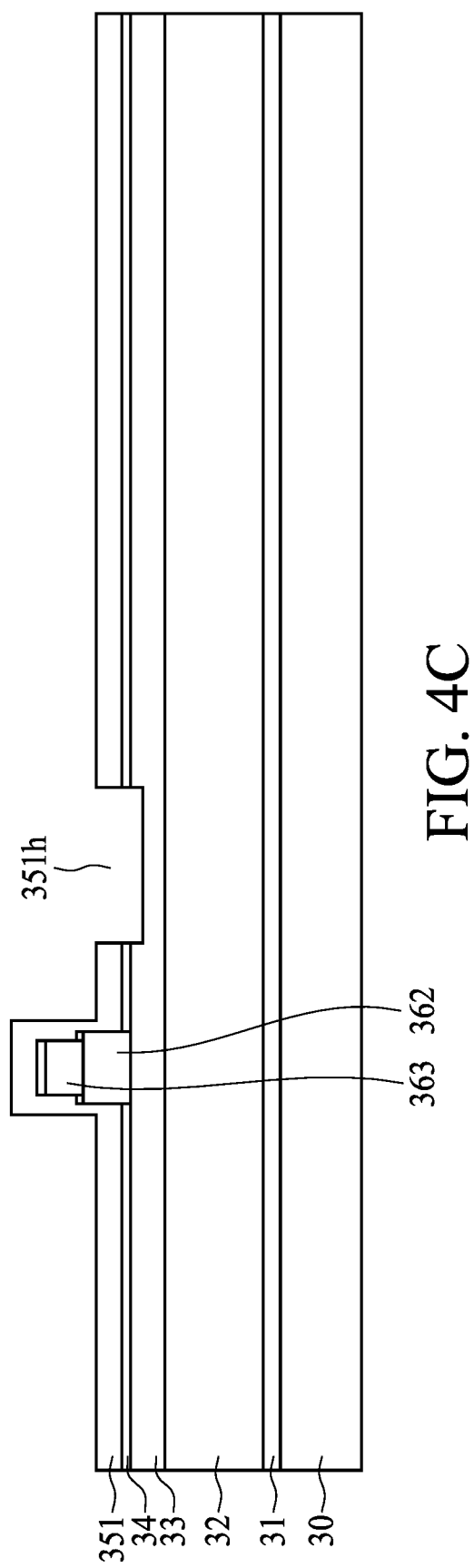

Referring to FIG. 4C, a passivation layer 351 is formed to cover the insulation layer 34, the conductive structure 363 and the doped semiconductor layer 362. In some embodiments, the passivation layer 351 may be formed by, CVD, high density plasma (HDP) CVD, spin-on, sputtering, or any other suitable operations. A portion of the passivation layer 351 and a portion of the insulation layer 34 are then removed to form an opening 351h (or a hole or a recess) to expose a portion of the semiconductor layer 33. In some embodiments, a portion of the semiconductor layer 33 may be removed as shown in FIG. 4C. In some embodiments, the opening 351h may be formed by etching or any other suitable operations.

Figure 4D:
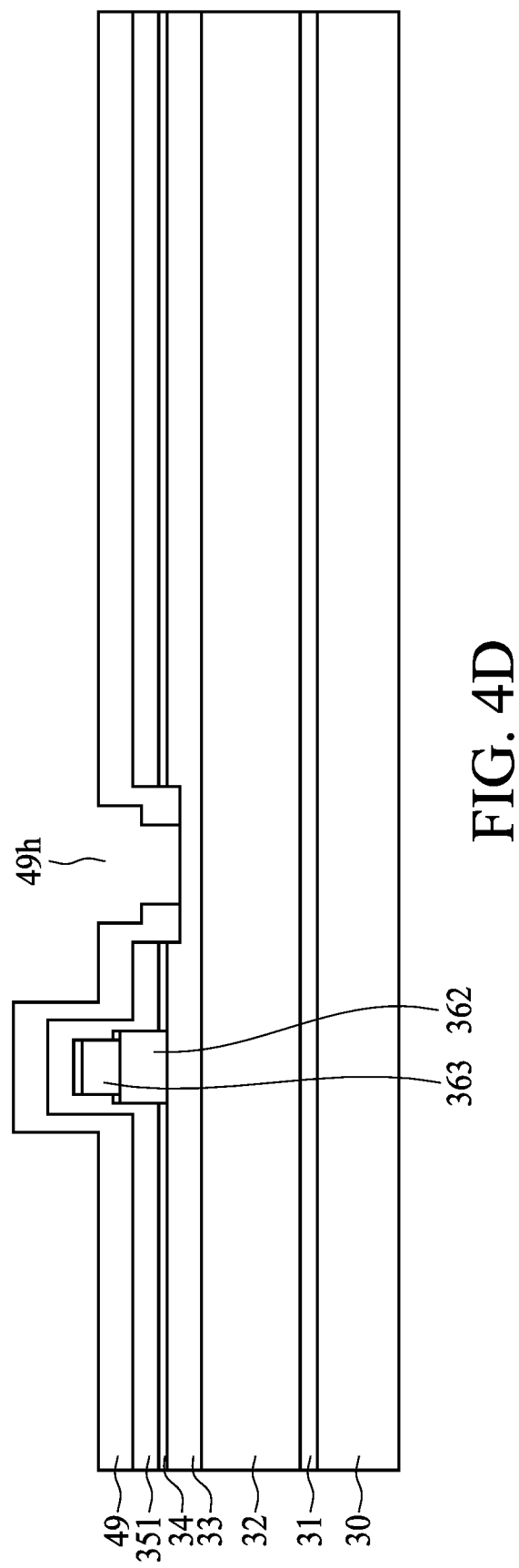

Referring to FIG. 4D, an insulation layer 49 is formed on the passivation layer 351. The insulation layer 49 is further formed within the opening 351h and on a portion of the semiconductor layer 33 exposed from the passivation layer 351. Then, a portion of the insulation layer 49 is removed to form an opening 49h. In some embodiments, the portion of the insulation layer 49 may be removed by etching or any other suitable operations.

Figure 4E:
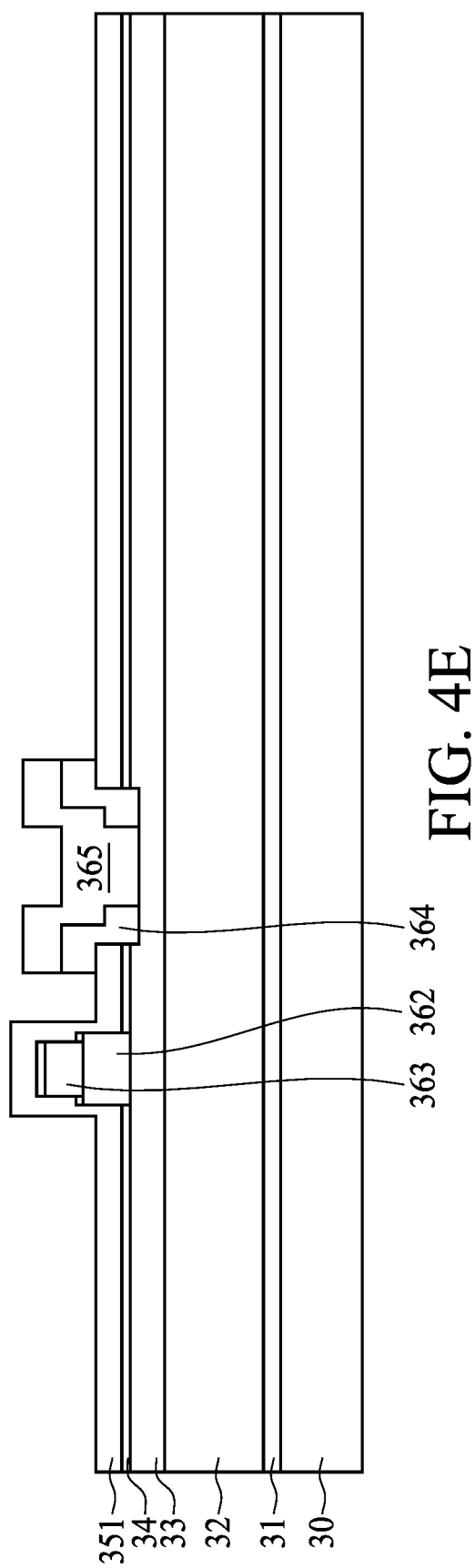

Referring to FIG. 4E, a metal layer is formed on the insulation layer 49 and within the opening 49h. A portion of the metal layer and the insulation layer 49 is then removed to form the insulation layer 364 and the conductive structure 365 as shown in FIG. 4E. In some embodiments, the portion of the metal layer and the insulation layer 49 may be removed by etching or any other suitable operations.

Figure 4F:
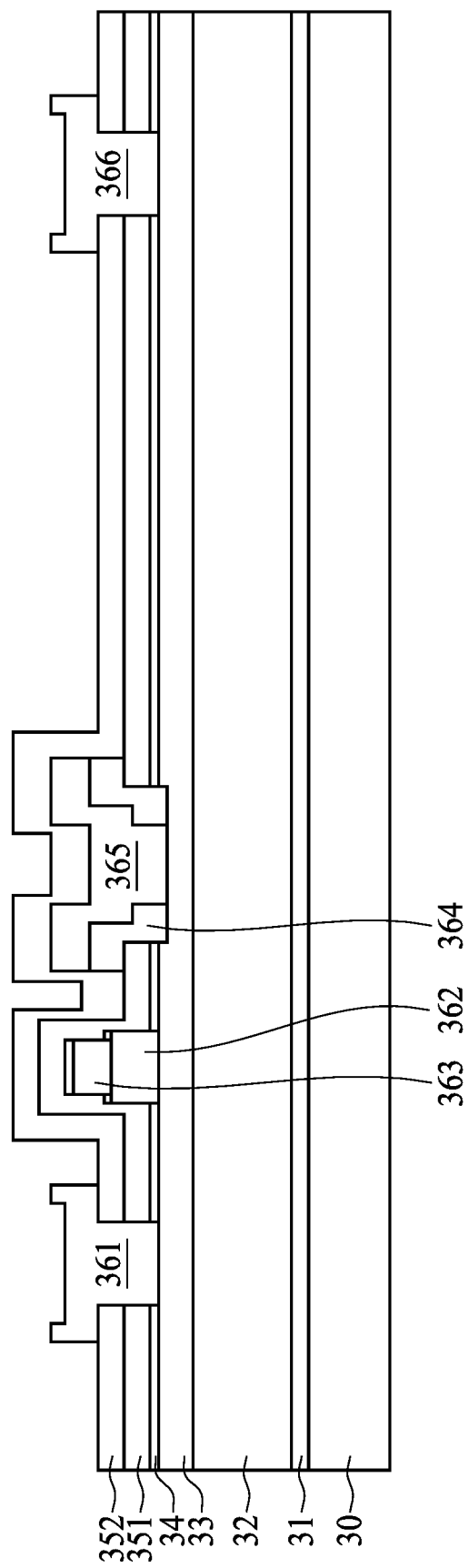

Referring to FIG. 4F, a passivation layer 352 is formed on the passivation layer 351. The passivation layer 352 covers the conductive structure 365. In some embodiments, the passivation layer 352 may be formed by, CVD, HDP CVD, spin-on, sputtering, or any other suitable operations. A portion of the passivation layers 351, 352 and the insulation layer 34 is removed to form openings to expose a portion of a top surface of the semiconductor layer 33. The conductive structures 361 and 366 are respectively formed within the openings to contact the portion of the top surface of the semiconductor layer 33. In some embodiments, the conductive structures 361 and 366 may be formed by deposition operations, such as CVD, PVD, electroplating or any other suitable operations. In some embodiments, the conductive structures 361 and 362 form an intermetallic compound with the semiconductor layer 33 through rapid thermal anneal (RTA), thereby forming an Ohmic contact to the channel region within the semiconductor layer 32.

Figure 4G:
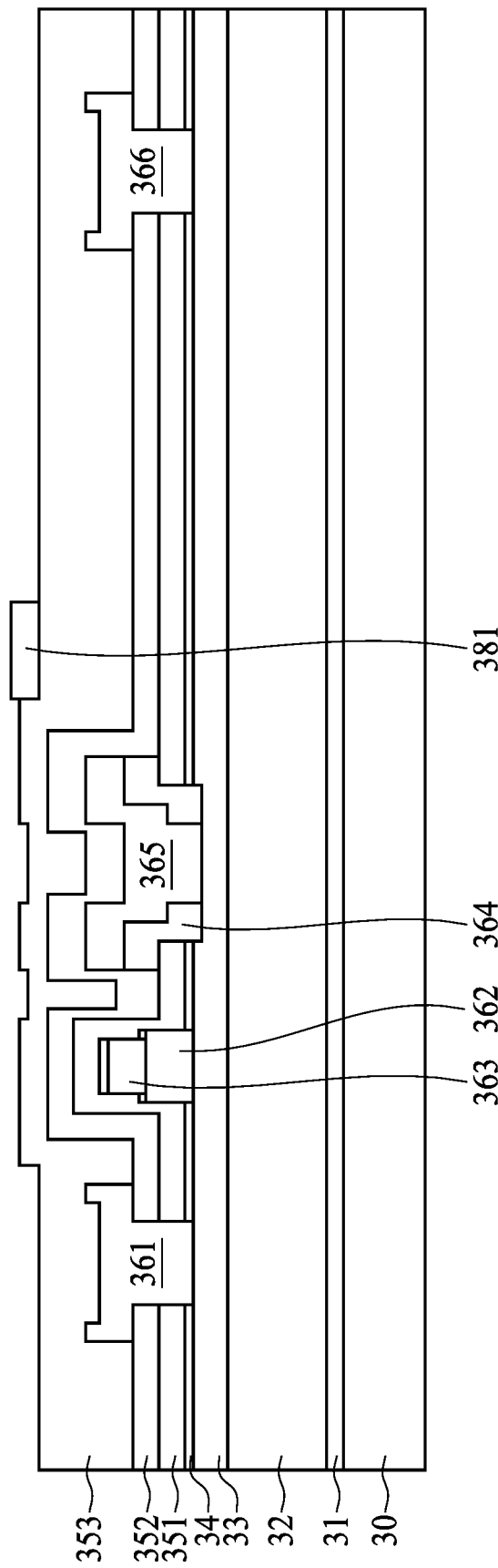

Referring to FIG. 4G, a passivation layer 353 is formed on the passivation layer 352. The passivation layer 353 covers a portion of the conductive structures 361 and 366. In some embodiments, the passivation layer 353 may be formed by, CVD, HDP CVD, spin-on, sputtering, or any other suitable operations. A field plate 381 is then formed on the passivation layer 353. In some embodiments, the field plate 381 may be formed by depositing a conductor material, depositing a metal by sputtering, and then patterning by dry etching.

Figure 4H:
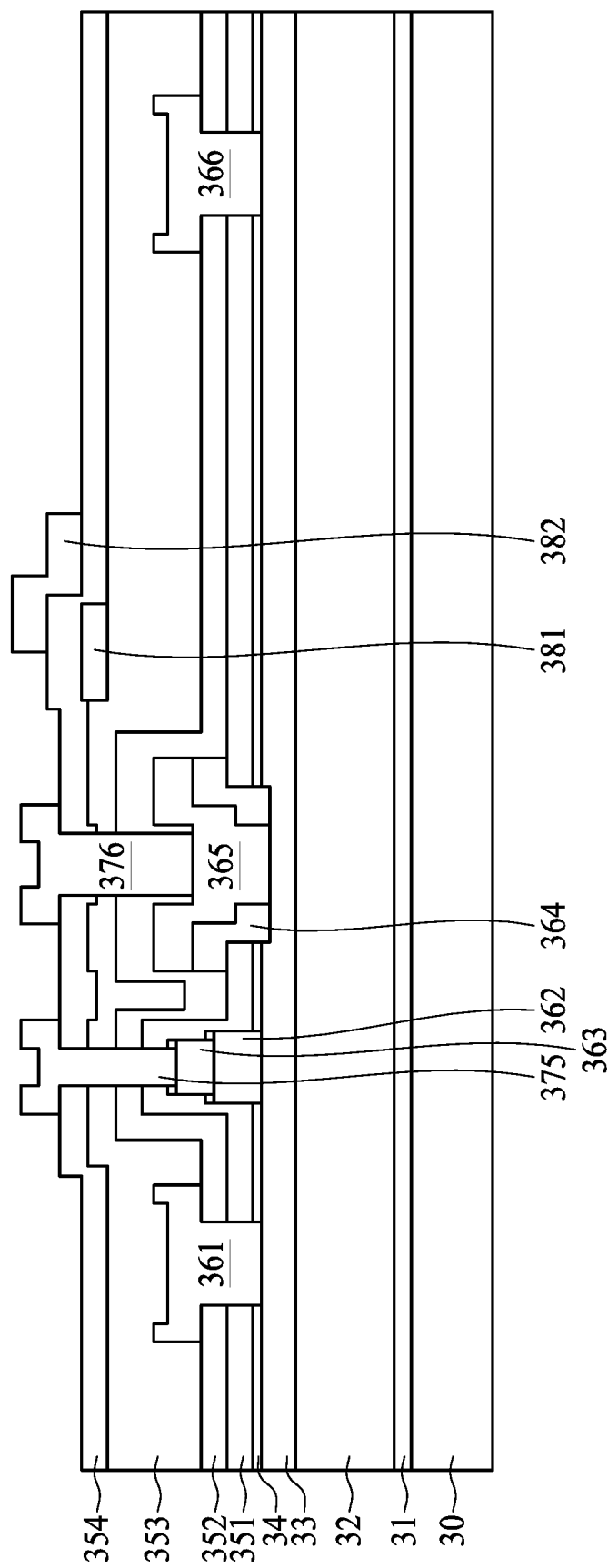

Referring to FIG. 4H, a passivation layer 354 is formed on the passivation layer 353. The passivation layer 354 covers the field plate 381. In some embodiments, the passivation layer 354 may be formed by, CVD, HDP CVD, spin-on, sputtering, or any other suitable operations. A field plate 382 is then formed on the passivation layer 354. In some embodiments, the field plate 382 may be formed by depositing a conductor material, depositing a metal by sputtering, and then patterning by dry etching.

A portion of the passivation layers 351, 352, 353 and 354 is removed to form openings to expose a portion of a top surface of each of the conductive structures 363 and 365. The conductive structures 375 and 376 are then respectively formed within the openings to contact the portion of the top surface of the conductive structures 363 and 365. In some embodiments, the conductive structures 375 and 376 may be formed by deposition operations, such as CVD, PVD, electroplating or any other suitable operations.

Figure 4I:
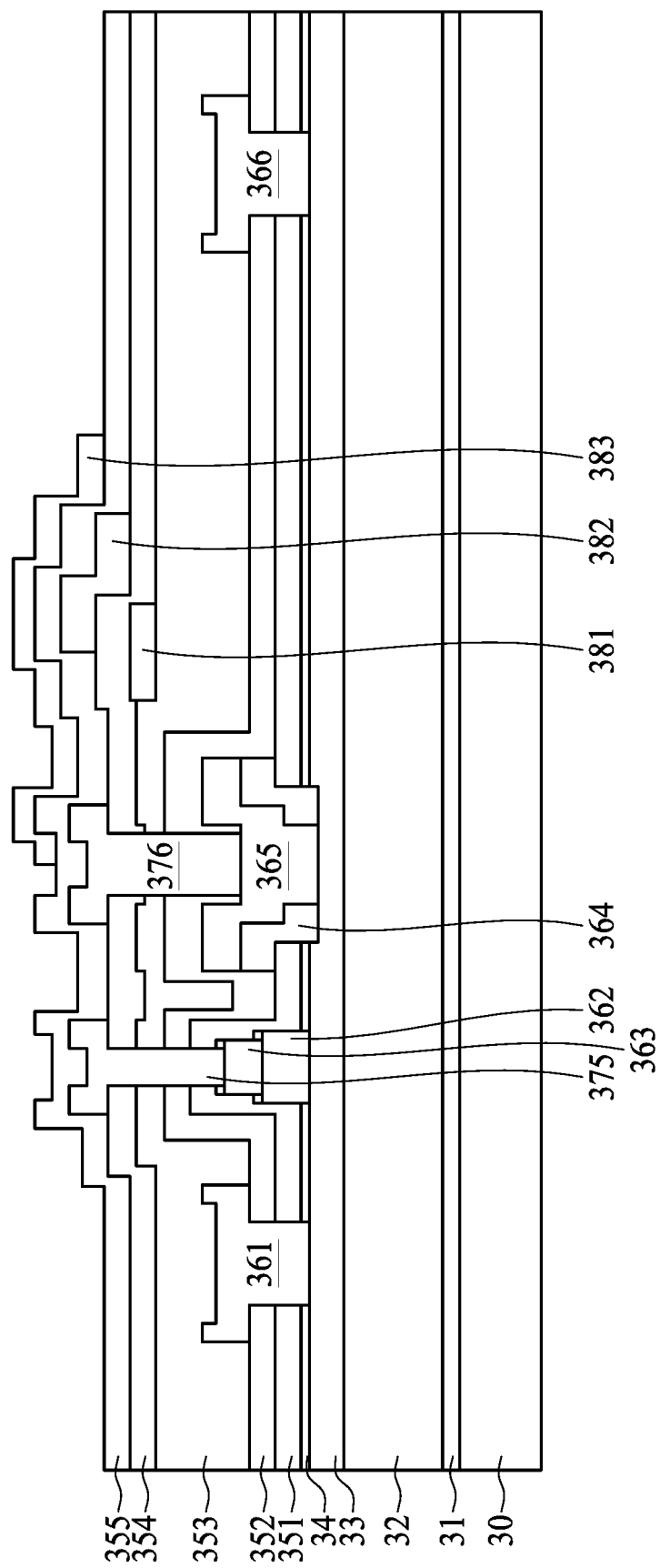

Referring to FIG. 4I, a passivation layer 355 is formed on the passivation layer 354. The passivation layer 355 covers the field plate 382 and a portion of the conductive structures 375 and 376. In some embodiments, the passivation layer 355 may be formed by, CVD, HDP CVD, spin-on, sputtering, or any other suitable operations. A field plate 383 is then formed on the passivation layer 355. In some embodiments, the field plate 383 may be formed by depositing a conductor material, depositing a metal by sputtering, and then patterning by dry etching.

Figure 4J:
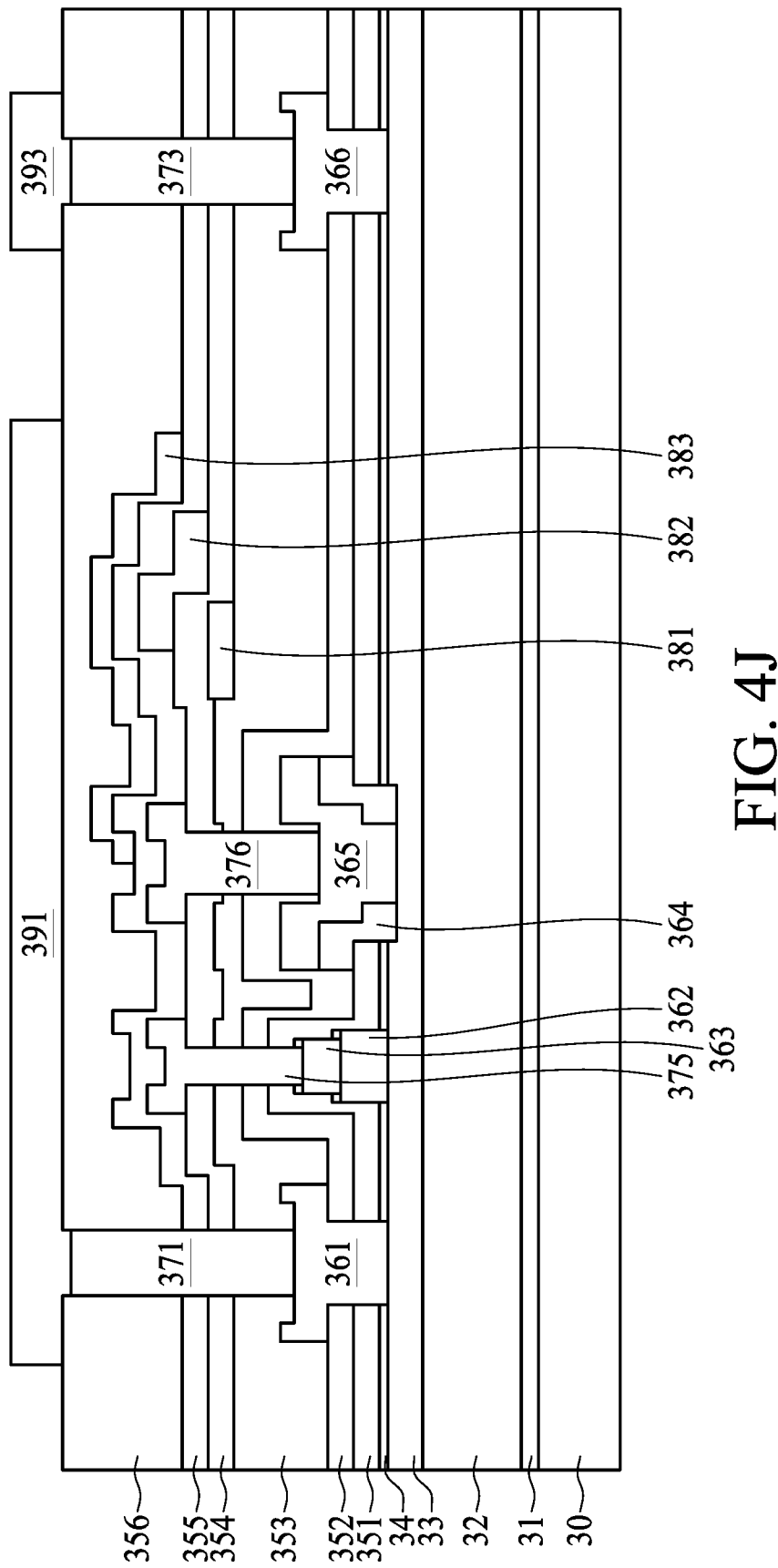

Referring to FIG. 4J, a passivation layer 356 is formed on the passivation layer 355. The passivation layer 356 covers the field plate 383. In some embodiments, the passivation layer 356 may be formed by, CVD, HDP CVD, spin-on, sputtering, or any other suitable operations.

A portion of the passivation layers 353, 354, 355 and 356 is removed to form openings to expose a portion of a top surface of each of the conductive structures 361 and 366. The conductive structures 371 and 373 are then respectively formed within the openings to contact the portion of the top surface of the conductive structures 361 and 366. Conductive structures 391 and 393 are then formed on the passivation layer 356 and respectively contact the conductive structures 371 and 373. In some embodiments, the conductive structures 371, 373, 391 and 393 may be formed by deposition operations, such as CVD, PVD, electroplating or any other suitable operations.

Figure 4K:
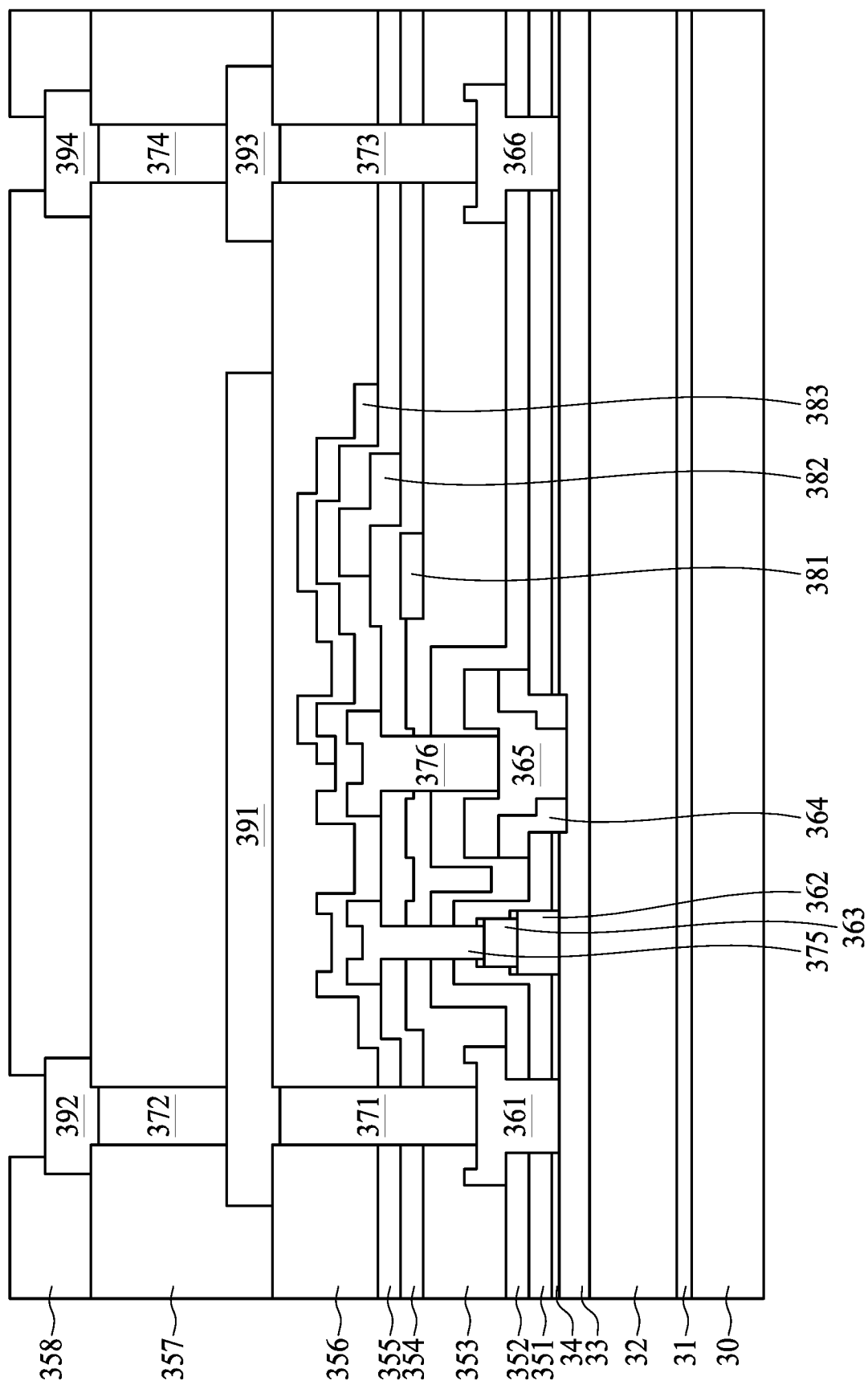

Referring to FIG. 4K, a passivation layer 357 is formed on the passivation layer 356. The passivation layer 357 covers the conductive structures 391 and 392. In some embodiments, the passivation layer 357 may be formed by, CVD, HDP CVD, spin-on, sputtering, or any other suitable operations.

A portion of the passivation layer 357 is removed to form openings to expose a portion of a top surface of each of the conductive structures 391 and 393. The conductive structures 372 and 374 are then respectively formed within the openings to contact the portion of the top surface of the conductive structures 391 and 393. Conductive structures 392 and 394 are then formed on the passivation layer 357 and respectively contact the conductive structures 372 and 374. In some embodiments, the conductive structures 372, 374, 392 and 394 may be formed by deposition operations, such as CVD, PVD, electroplating or any other suitable operations.

A passivation layer 358 is formed on the passivation layer 357. The passivation layer 358 covers the conductive structures 392 and 394. In some embodiments, the passivation layer 358 may be formed by, CVD, HDP CVD, spin-on, sputtering, or any other suitable operations. A portion of the passivation layer 358 is then removed to form openings to expose a portion of a top surface of each of the conductive structures 392 and 394 for electrical connections.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 within 5 within or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:
1. A semiconductor structure, comprising:
a first nitride semiconductor layer;
a second nitride semiconductor layer disposed on the first nitride semiconductor layer; and
a first conductive structure disposed on the second nitride semiconductor layer,
wherein the first conductive structure functions as one of a drain and a source of a transistor and one of an anode and a cathode of a diode;

wherein the semiconductor structure further comprises a first field plate, a second field plate and a third field plate, wherein the first field plate, the second field plate and the third field plate are not in direct physical contact with each other, and are all disposed between the drain and a gate of the transistor, and the first field plate, the second field plate and the third field plate are at three different layers respectively, and are partially or fully overlapping in a direction perpendicular to an upper surface of the second nitride semiconductor layer;

wherein the semiconductor structure further comprises a first passivation layer, a second passivation layer, a third passivation layer, and a fourth passivation layer sequentially disposed on the second nitride semiconductor layer;

wherein the first field plate is disposed between the first passivation layer and the second passivation layer, the second field plate is disposed between the second passivation layer and the third passivation layer, and the third field plate is disposed between the third passivation layer and the fourth passivation layer;

wherein at least one of the first field plate, the second field plate and the third field plate comprises a stepped surface, and at least one of the first passivation layer, the second passivation layer, the third passivation layer and the fourth passivation layer comprises a stepped surface.

2. The semiconductor structure of claim 1, wherein the first conductive structure defines the drain of the transistor and the cathode of the diode.

3. The semiconductor structure of claim 1, further comprising:
a second conductive structure on the second nitride semiconductor layer and defining another one of the drain and the source of the transistor; and
a third conductive structure on the second nitride semiconductor layer and defining another one of the anode and the cathode of the diode.

4. The semiconductor structure of claim 3, wherein the third conductive structure is between the first conductive structure and the second conductive structure.

5. The semiconductor structure of claim 3, further comprising a fourth conductive structure disposed on the second nitride semiconductor layer and defining the gate of the transistor, wherein a distance between the fourth conductive structure and third conductive structure is less than a distance between the fourth conductive structure and the first conductive structure.

6. The semiconductor structure of claim 5, further comprising a doped semiconductor layer between the fourth conductive structure and the second nitride semiconductor layer.

7. The semiconductor structure of claim 3, wherein the second conductive structure is electrically connected to the third conductive structure.

8. The semiconductor structure of claim 1, wherein the first nitride semiconductor layer and the second nitride semiconductor layer defines an electron channel region within the first nitride semiconductor layer and adjacent to an interface between the first nitride semiconductor layer and the second nitride semiconductor layer.

9. The semiconductor structure of claim 1, wherein the transistor is a high-electron-mobility transistor (HEMT) and the diode is a Schottky barrier diode (SBD).

10. A semiconductor structure, comprising:
a first nitride semiconductor layer having a first surface;
a transistor having a drain and a source on the first surface of the first nitride semiconductor layer; and
a diode having an anode and a cathode on the first surface of the first nitride semiconductor layer,
wherein the anode and the cathode of the diode are arranged in a direction substantially parallel to the first surface of the first nitride semiconductor layer;
wherein the semiconductor structure further comprises a first field plate, a second field plate and a third field plate, wherein the first field plate, the second field plate and the third field plate are not in direct physical contact with each other, and are all disposed between the drain and a gate of the transistor, and the first field plate, the second field plate and the third field plate are at three different layers respectively, and are partially or fully overlapping in a direction perpendicular to the first surface of the first nitride semiconductor layer;
wherein the semiconductor structure further comprises a first passivation layer, a second passivation layer, a third passivation layer, and a fourth passivation layer sequentially disposed on the first nitride semiconductor layer;
wherein the first field plate is disposed between the first passivation layer and the second passivation layer, the second field plate is disposed between the second passivation layer and the third passivation layer, and the third field plate is disposed between the third passivation layer and the fourth passivation layer;
wherein at least one of the first field plate, the second field plate and the third field plate comprises a stepped surface, and at least one of the first passivation layer, the second passivation layer, the third passivation layer and the fourth passivation layer comprises a stepped surface.

11. The semiconductor structure of claim 10, wherein the drain of the transistor and the cathode of the diode share a first conductive structure.

12. The semiconductor structure of claim 10, further comprising:
a second conductive structure on the first surface of the first nitride semiconductor layer and defining the source of the transistor;
a third conductive structure on the first surface of the first nitride semiconductor layer and defining the anode of the diode; and
a fourth conductive structure over the first surface of the first nitride semiconductor layer and defining the gate of the transistor,
wherein a distance between the fourth conductive structure and third conductive structure is less than a distance between the fourth conductive structure and the first conductive structure.

13. The semiconductor structure of claim 12, further comprising a doped semiconductor layer between the fourth conductive structure and the first surface of the first nitride semiconductor layer.

14. The semiconductor structure of claim 12, wherein the second conductive structure is electrically connected to the third conductive structure.

15. The semiconductor structure of claim 10, further comprising:
a second nitride semiconductor layer on a second surface of the first nitride semiconductor layer opposite to the first surface; and a channel layer within the second nitride semiconductor layer and adjacent to an interface between the first nitride semiconductor layer and the second nitride semiconductor layer.

16. The semiconductor structure of claim 10, wherein the transistor is a high-electron-mobility transistor (HEMT), and the diode is a Schottky barrier diode (SBD).

\* \* \* \* \*